United States Patent [19]

Nakao

[11] Patent Number: 5,097,890
[45] Date of Patent: Mar. 24, 1992

[54] HEAT TREATING APPARATUS WITH COOLING FLUID NOZZLES

[75] Inventor: Ken Nakao, Sagamihara, Japan

[73] Assignee: Tel Sagami Limited, Kanagawa, Japan

[21] Appl. No.: 624,473

[22] Filed: Dec. 10, 1990

Related U.S. Application Data

[63] Continuation of Ser. No. 367,313, Jun. 16, 1989, abandoned.

[30] Foreign Application Priority Data

Jun. 16, 1988 [JP] Japan .................. 63-148676
Mar. 6, 1989 [JP] Japan .................... 1-53508

[51] Int. Cl.$^5$ .......................... H05B 3/64; F27B 5/16; F27D 9/00
[52] U.S. Cl. ........................ 165/39; 165/61; 165/64; 118/724; 118/725; 219/390; 432/144
[58] Field of Search ............... 118/724, 725; 165/61, 165/58, 64, 39; 432/144; 219/390

[56] References Cited

U.S. PATENT DOCUMENTS

| | | | |
|---|---|---|---|
| 2,700,365 | 1/1955 | Pawlyk ................. | 118/725 |
| 3,167,812 | 2/1965 | Bennigsen ............. | 165/30 |
| 3,470,624 | 10/1969 | Plotkowiak ........... | 165/61 |
| 3,862,397 | 1/1975 | Andersen et al. ..... | 118/724 |
| 3,922,527 | 11/1975 | Witkin et al. ......... | 165/32 |
| 3,964,430 | 6/1976 | Purmal .................. | 118/725 |
| 4,753,192 | 6/1988 | Goldsmith et al. .... | 118/725 |
| 4,858,557 | 8/1989 | Pozzetti et al. ....... | 118/725 |
| 4,950,870 | 8/1990 | Mitsuhashi et al. ... | 219/390 |
| 4,957,781 | 9/1990 | Kanegae et al. ...... | 219/390 |

FOREIGN PATENT DOCUMENTS

| | | |
|---|---|---|
| 3433433 | 10/1985 | Fed. Rep. of Germany ...... 432/144 |
| 5824711 | 5/1983 | Japan . |
| 608622 | 3/1985 | Japan . |
| 61157325 | 9/1986 | Japan . |

Primary Examiner—John Ford
Attorney, Agent, or Firm—Oblon, Spivak, McClelland, Maier & Neustadt

[57] ABSTRACT

A cooling system is disclosed which is incorporated in a heat treating apparatus for use in a manufacturing process of a semiconductor device etc. The heat treating apparatus includes a reaction tube for receiving products to be heat treated in its uniformly heated zone, and a heater which surrounds the reaction tube. Inlet means for blowing a cooling fluid and exhaust means for collecting that cooling fluid which is heated after the cooling function thereof has been achieved are provided. The fluid is blown from the inlet means around the reaction tube, substantially perpendicular to the axis of the reduction tube, and as a result, a flow of cooling fluid from the inlet means toward the exhaust means is established beyond the length of the uniformly heated zone, thus the entire reaction zone within the reaction tube is uniformly cooled.

5 Claims, 6 Drawing Sheets

HEAT TREATING APPARATUS WITH COOLING FLUID NOZZLES

This application is a continuation of Ser. No. 367,313, filed on June 16, 1989, now abandoned.

BACKGROUND OF THE INVENTION

1. Field of the Invention

The present invention relates to a heat treating apparatus used in the manufacturing of a semiconductor device, a liquid-crystal driving circuit board, and so on and, in particular, to the improvement of a reaction tube cooling system for this type of heat treating apparatus.

2. Description of the Related Art

As part of the process for manufacturing semiconductor devices, liquid crystal driving circuits, and so on, a vertical or a horizontal type heat treating apparatus is in widespread use for heating products, such as semiconductor wafers and circuits, requiring heat treatment, thereby to facilitate film formation, diffusion, oxidation, etching, and so on.

In the aforementioned heat treating apparatus, the reaction tube into which is placed those products to be heat treated, is constructed of a cylindrical tube made of, for example, quartz, and in a typical apparatus, has a cylindrical liner tube made of, for example, silicon carbide located around the outer periphery thereof. A heating element is wound in the form of a coil around the liner tube, and is itself surrounded by heat insulation.

In use, the interior of the reaction tube is initially heated to a predetermined treatment temperature—for example, several hundred to a thousand and several hundred of degrees—and products to be heat treated, such as the semiconductor wafers on a wafer boat, are loaded into the reaction tube through the lower opening thereof in the case of a vertical type apparatus, and through one end thereof in the case of a horizontal type apparatus. Then, a predetermined reaction gas, such as $SiH_4$, $O_2$, $B_2H_6$, and $PH_3$ is supplied into the reaction tube so as to form a film on the semiconductor wafer or to perform some other treatment, such as diffusion.

As products to be heat treated become increasingly sophisticated, it is necessary that the heat treating apparatus be provided with a cooling system which can rapidly and uniformly cool the entire reaction zone within the reaction tube, since the above cooling treatment is important in order to obtain a uniform thermal treatment history in the one or more semiconductor wafers being treated, as well as to reduce the process time.

Japanese Patent Publication (KOKOKU) 58-24711 discloses a cooling system used in a horizontal type heat treating apparatus. In this cooling system, a cooling pipe is arranged within the heat insulation surrounding the heating coil, resulting in a cooling function of low efficiency.

Japanese Patent Publication (KOKOKU) 60-8622 discloses another type of cooling system used in a horizontal type heat treating apparatus. In this system, a heater is directly located around the reaction tube and is enclosed in a heater casing, as a result of which a liner tube is not required. A cooling fluid is moved, by means of a blower, from one end of the reaction tube into a space between the outer surface thereof and the inner surface of the heater casing, and is exhausted through the other end of the tube. In the system as set forth above, the flow of cooling liquid along the reaction tube is, however, likely to deviate from a desired flow pattern, failing to cool the entire reaction zone within the reaction tube uniformly.

Japanese Utility Model Disclosure (KOKAI) 61-157325, on the other hand, discloses a cooling system used in a barrel type heat treating apparatus. In this cooling system, a heating coil is located inside the inner cylinder of a reaction tube on which a semiconductor wafer is supported by means of a susceptor. A cooling liquid is blown from the upper portion of the apparatus in a tangential direction of the outer cylinder of the reaction tube to allow it to flow along the outer surface of the outer cylinder of the reaction tube, and is exhausted through the lower portion of the apparatus. In this system, a cooling function is not so efficient, due to the lingering heat of the heating coil situated within the inner cylinder of the reaction tube. Furthermore, due to a greater temperature difference between both side surfaces of the semiconductor wafers, the semiconductor wafers might be deformed when they were cooled rapidly.

SUMMARY OF THE INVENTION

An object of the present invention is to provide a heat treating apparatus having a reaction tube cooling system which, in order to obtain a uniform thermal treatment history in one or more products to be heat treated, can uniformly cool the entire reaction zone within the reaction tube.

Another object of the present invention is to provide a heat treating apparatus having a reaction tube cooling system which, in order to achieve positive reaction control and reduce the process time, can rapidly and uniformly cool the entire reaction zone within the reaction tube.

In order to achieve the aforementioned object, according to the present invention, there is provided a heat treating apparatus comprising a reaction tube for enclosing products to be heat treated within an inner, uniformly heated zone, a heater for enclosing the reaction tube, inlet nozzles for blowing a cooling fluid around the reaction tube substantially perpendicular to the axis of the reaction tube and exhaust means for collecting that cooling fluid which is heated after the cooling function thereof has been achieved, in which a flow of the cooling fluid from the inlet means toward the exhaust means is created beyond the whole length of the uniformly heated zone.

The uniformly heated zone has to cover at least a reaction zone for performing a heat treatment of the products to be treated or adequately cover it.

In some embodiments, the cooling fluid may be created along the outer surface of the reaction tube so as to directly cool the outer surface of the reaction tube, or, alternatively, may be created to indirectly cool the outer surface, in the case of other embodiments.

The inlet nozzles may blow a cooling fluid in one direction around the outer periphery of the reaction tube in the case of the reaction tube having a substantially vertical longitudinal axis and in two directions around the outer periphery of the reaction tube in the case of the reaction tube having a substantially horizontal longitudinal axis.

If the inlet nozzle is provided at one place in the longitudinal direction of the reaction tube whose longitudinal axis is substantially vertical, then it may be located at a substantially lowest portion of the reaction tube.

If, on the other hand, the inlet nozzle is provided at a plurality of places in the longitudinal direction of the reaction tube whose longitudinal axis is substantially vertical, the intervals of the inlet nozzle may become smaller toward the upper portion of the uniformly heated zone along the longitudinal direction of the reaction tube.

In the case where the inlet nozzle is provided at a plurality of places in the longitudinal direction of the reaction tube whose longitudinal axis is substantially horizontal, the inlet nozzle may be located opposite to the lowest portion of the reaction tube in a symmetrical relation to a center of a length of the uniformly heated zone.

If the inlet nozzle is provided at a plurality of places in the longitudinal direction of the reaction tube, a plurality of temperature sensors may be provided along the longitudinal direction of the uniformly heated zone in which case a flow of a cooling fluid blown from the inlet means may be individually controlled based upon the detection temperature data of the sensors.

If the inlet nozzle is provided at a plurality of locations in the longitudinal direction of the reaction tube with a liner tube placed between the reaction tube and the heater, the inlet nozzle may be movable between a position where the forward end portion of the inlet nozzle extends through the inner surface of the liner tube toward the proximity of the reaction tube and a position where the forward end portion of the nozzle is retracted into the inner surface of the liner tube.

The features and advantages of the present invention will become apparent from the following explanation made in conjunction with the accompanying drawings.

DETAILED DESCRIPTION OF THE PREFERRED EMBODIMENTS

Figure 1:
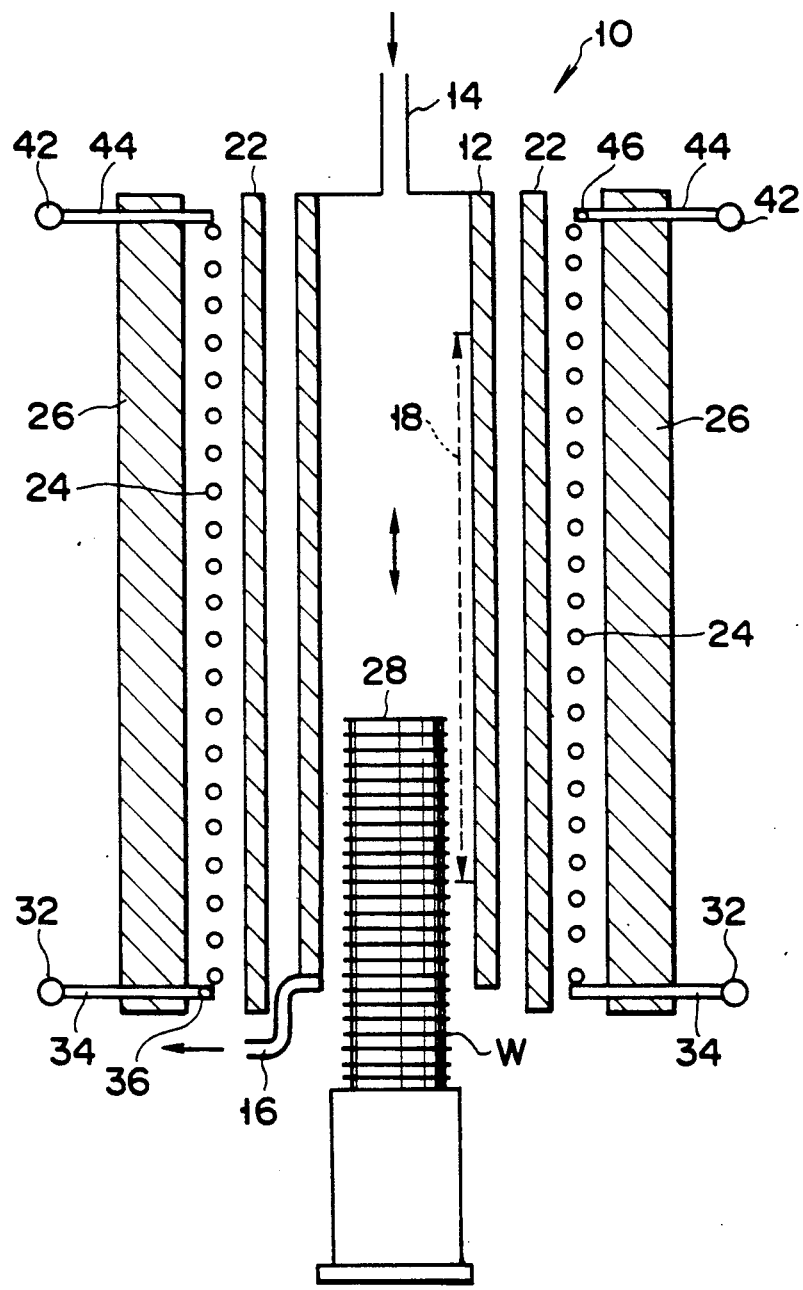
FIG. 1 is a front view, partly in longitudinal cross-section showing a vertical type heat treating apparatus with a reaction tube cooling system according to one embodiment of the present invention.

As shown in FIG. 1, a reaction tube (process tube) 12 of a cylindrical configuration made of, for example, quartz is substantially vertically placed at a center of a vertical heat treating apparatus 10 with a reaction tube cooling system according to one embodiment of the present invention. A pipe 14 is connected to the top of the reaction tube 12 to introduce a predetermined reaction gas in which the pipe is connected to a gas feeding source, not shown. An exhaust pipe 16 is connected to the bottom of the reaction tube 12 and communicates with a recovery section, not shown.

In order to provide a uniformly-heated zone 18 within the reaction tube 12, a liner tube 22 made of, for example, silicon carbide is coaxially located around the outer periphery of the reaction tube 12 and a heating device, such as a coil-like heater 24, is wound around the outer periphery of the liner tube 22 with a spacing left therebetween. The outer diameter of the reaction tube 12, the inner diameter of the tube 22 and the inner diameter of the heater are 208 mm, 250 mm, and 285 mm, respectively. Heat insulation 26 is located around the outer periphery of the heater 24 and has a dense and smooth inner wall surface, preventing generation of dust resulting from a flow of a cooling fluid.

Figure 2:
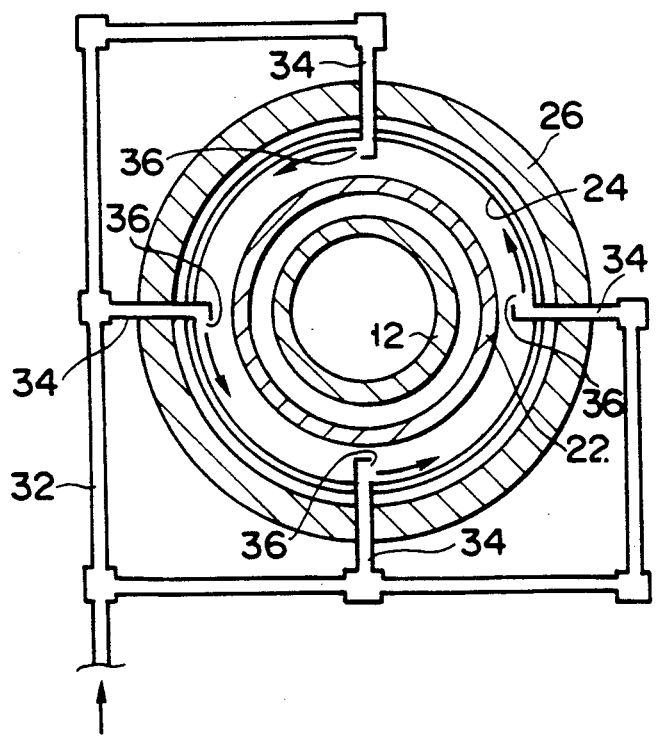
FIG. 2 is a bottom view, partly in cross-section, showing the apparatus of FIG. 1.

A cooling fluid pipe 32 which is connected to, for example, a blower (not shown) is arranged at the outer lower area of the heat insulation 26 as shown in FIG. 2 and four inlet nozzles 34 extend at a 90° interval from the pipe 32 toward an inner spacing, that is, their forward ends extend through the heat insulation 26 into a spacing which is defined between the tube 22 and the heat insulation 26 with the heater 24 located therebetween. A blowing port 36 of the forward end portion of the respective inlet nozzle 34 is oriented such that, as viewed in a top plan, the cooling fluid is blown in a counter-clockwise direction.

Cooling fluid exhaust pipe 42 which is connected to a suction means, not shown, is located at the upper area of the exterior of heat insulation 26, in the same fashion as that of the cooling fluid inlet pipe 32; that is, its nozzles 44 extend at a 90° interval from the discharge pipe 42 toward an inner spacing. The exhaust nozzle 44 is similar in configuration to the inlet nozzle 34, but an opening 46 of the nozzle 44 is oriented in a direction opposite to the blowing port 36.

In use, the reaction tube 12 of the aforementioned vertical heat treating apparatus 10 has an inner spacing initially heated by the heater 24 to a predetermined heat treating temperature of, for example, hundreds to one thousand and several hundred degrees, and products to be heat treated, such as semiconductor wafers W on a wafer boat 28, are loaded by, for example, a boat elevator (not shown), through the lower opening. A predetermined reaction gas, such as $SiH_4$, $O_2$, $B_2H_6$ and $PH_3$ is supplied into the reaction tube 12 to form a film on the semiconductor wafers or to subject the semiconductor wafers to diffusion etc.

If the interior of the reaction tube 12 is to be rapidly cooled, such as upon the conclusion of a reaction, a cooling fluid such as chilled air is fed from the cooling fluid inlet pipe 32 into the aforementioned spacing to provide forced air cooling for about 30 minutes. The air is blown horizontally (in a counter-clockwise direction as viewed in an upper plan view) from the inlet nozzles 34 into the spacing between the heat insulation 26 and the liner tube 22 around which the heater 24 is located. By virtue of heat emitted from the heater 24, the air ascends in spiral fashion, swirling around the tube 22, and is exhausted via the exhaust nozzles 44. By means of this air flow, the heater 24 is directly cooled at which time the interior of the reaction tube 12 is cooled. Furthermore, the air flows upwardly, while being spirally rotated around the tube 22, providing a uniform temperature within a horizontal plane.

Figure 3:
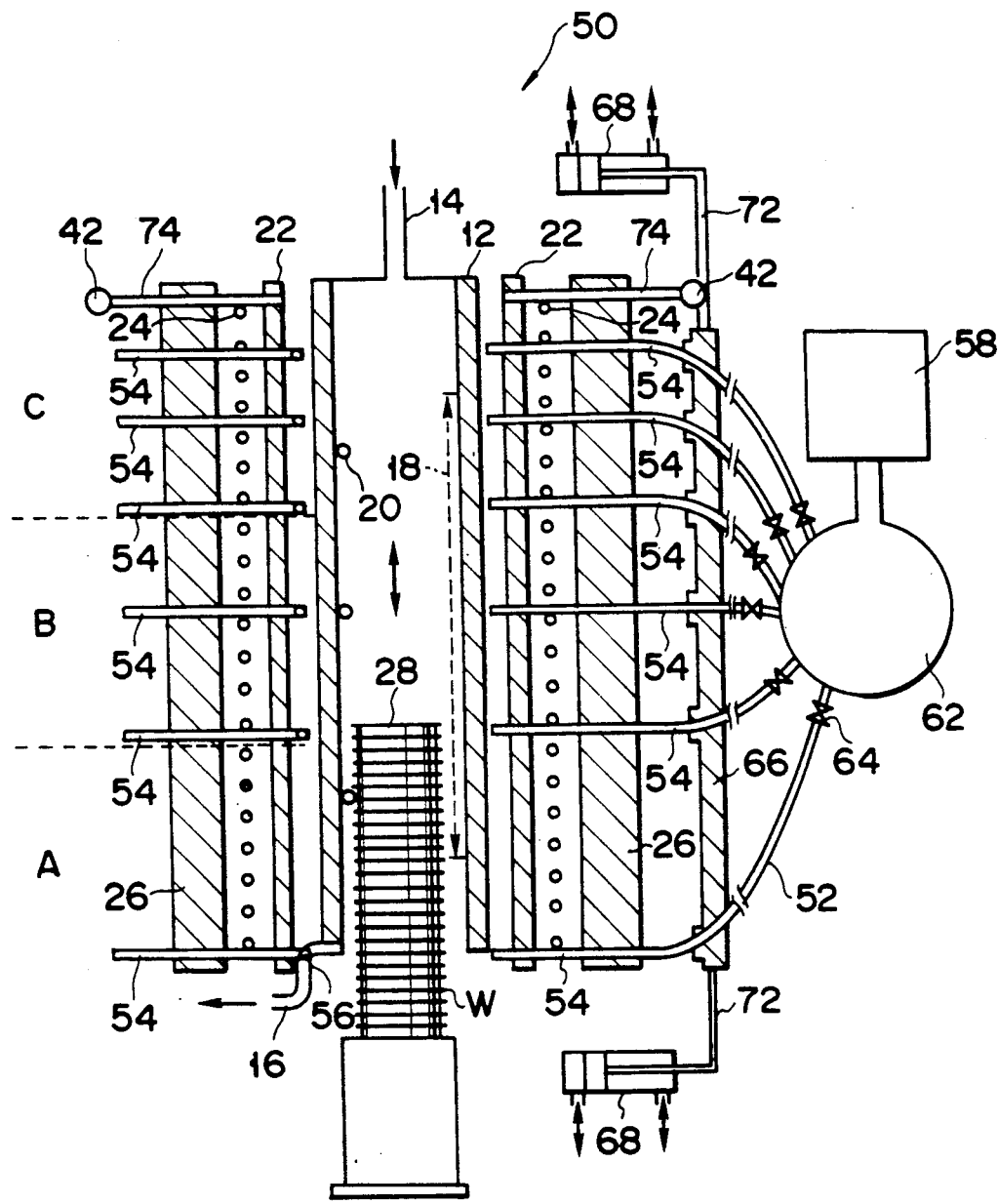
FIG. 3 is a front view, partly in cross-section, showing a vertical type heat treating apparatus with a reaction tube cooling system according to a second embodiment of the present invention.

A vertical type heat treating apparatus 50 with a reaction tube cooling system according to a second embodiment of the present invention, as shown in FIG. 3, has basically the same structure as that of the aforementioned vertical type heat treating apparatus 10. In the arrangement shown in FIG. 3, the same reference numerals are employed to designate the parts of units corresponding to those shown in FIG. 1.

To the top of a reaction tube 12 which is substantially vertically arranged, a pipe 14 is connected to admit a predetermined reaction gas into the reaction tube 12 and leads to a gas supply source, not shown. An exhaust pipe 16 is connected to the bottom of the reaction tube 12 and communicates with a recovery or collection section, not shown.

In order to provide a uniformly heated zone 18 within the reaction tube 12, a liner tube 22 made of, for example, silicon carbide is coaxially located around the outer periphery of the reaction tube 12 and a heating device, such as a coil-like heater 24, is wound around the outer periphery of the tube 22 with a spacing left relative to the outer surface of the tube 22. The outer diameter of the reaction tube 12, the inner diameter of the tube 22, and the inner diameter of the heater 24 are 208 mm, 250 mm, and 285 mm, respectively. Heat insulation 26 is located around the outer periphery of the heater 24 and has a dense and smooth inner wall surface.

In the arrangement of the present apparatus, the heater 24 is divided into a lower zone A, a middle zone B and an upper zone C, these zones can be independently operated so that the uniformly heated zone 18 in the reaction tube 12 may be controlled positively. The temperature prevailing at the uniformly heated zone 18 in the reaction tube 12 is detected on a continuous basis by sensors 20, such as thermocouples located at a plurality of locations along the uniformly heated zone 18. The detection temperature level is transmitted as data to a control mechanism, not shown. The control mechanism controls, based on the temperature level data, electric power to the heater 24 or the amount of fluid flowing through respective cooling fluid inlet nozzle 54 as will be set forth below.

Figure 4:
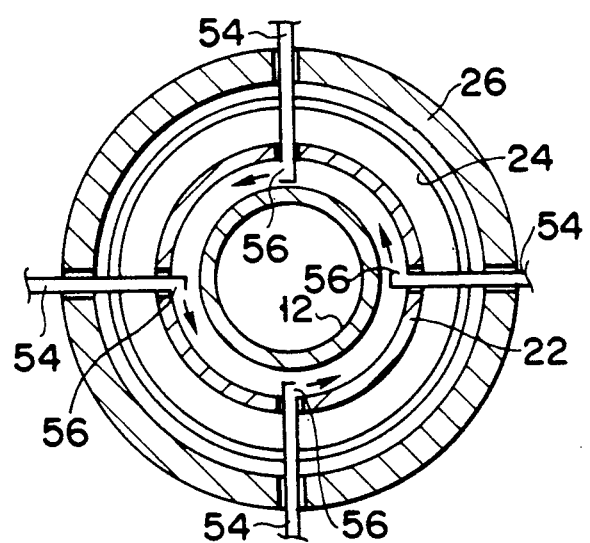
FIG. 4 is a bottom view, partly in cross-section, showing the apparatus of FIG. 3.

The cooling fluid inlet nozzles 54 are horizontally arranged at four places, at a 90° interval, around the reaction tube 12 as shown in FIG. 4. In all, six sets of inlet nozzles 54 are located at the aforementioned three zones, with one set in the lower zone A, two sets in the middle zone B, and three sets in the upper zone C, as shown in FIG. 3, as viewed along the vertical direction of the reaction tube. The inlet nozzle 54 is made of ceramics and has an inner diameter of 6 to 8 mm. The inlet nozzles extend through both the heat insulation 26 and liner tube 22 into a spacing which is defined between the liner tube 22 and the reaction tube 12. The blowing port 56 of the forward end portion of the inlet nozzle 54 is oriented to blow a cooling fluid in the counter-clockwise direction, as shown in FIG. 4, as viewed in a top plan view.

Each inlet nozzle 54 is connected via a pipe 52 to a manifold 62 which, in turn, is connected to a cooling fluid supply source 58 via a means such as a blower, not shown. A control valve 64 is provided at that pipe 52 associated with the nozzle 54 which is located near the manifold 62. This pipe arrangement allows the amount of cooling fluid which is to flow through the nozzle 54 to be controlled independently for each nozzle 54.

Outside the heat insulation 26, six inlet nozzles 54 in the same vertical plane are fixed to a common support plate 66. A pair of piston rods 72 which are associated with air cylinders 68 are attached to a corresponding one of both ends of the support plate 66. The driving of the air cylinder 68 causes the support plate 66 to be moved toward and away from the outer surface of the heat insulation 26 and hence the forward ends of the inlet nozzles 54 to be moved to an extending position where they extend through the liner tube 22 to the proximity of the reaction tube 12 and to a retracted position where they are retracted into the inner surface of the liner tube 22.

At the outer upper portion of the heat insulation 26, a cooling fluid exhaust pipe 42 which is connected to a suction means is located in the same fashion as in the embodiment shown in FIGS. 1 and 2. Four exhaust nozzles 74 extend at a 90° interval from the pipe 42 into an inner spacing; that is, the ports of the forward end portions of the four nozzles 74 extend through the liner tube 22 into a spacing which is defined between the reaction tube 12 and the liner tube 22.

Although, in the arrangement shown in FIG. 3, a piping array leading from the inlet nozzle 54 to the cooling fluid supply source 58, support plate 66 for driving the nozzles 54, air cylinders 68, and so on have been explained in connection with the six inlet nozzles 54 as indicated by the right side in FIG. 3, the same thing can be true of the other inlet nozzles 54 which are located at a 90° interval and at the other three places around the reaction tube 12.

In use, the interior of the reaction tube 12 is initially heated by the heater 24 to a predetermined treatment temperature and a plurality of products, such as semiconductor wafers W, are loaded into the reaction tube 12 via the lower opening of the reaction tube. A predetermined gas is fed into the reaction tube 12 to form a film on the semiconductor wafer or to subject the semiconductor wafer to treatments, such as diffusion. At the time of heating the reaction tube 12, the air cylinder 68 is operated by a control mechanism (not shown) so that all the inlet nozzles 54 are held at the retracted position. Thus the inlet nozzles 54 are held retracted from the inner surface of the liner tube 22, thus preventing a fall in thermal efficiency resulting from the conduction of heat, etc., via the nozzle 54.

If the interior of the reaction tube 12 is to be rapidly cooled, then the air cylinder 68 is operated by the control mechanism (not shown) and all the input nozzles 54 extend through the inner surface of the liner tube 22 toward the proximity of the reaction tube 12, that is, are moved to the extended position. The flow control valve 64 associated with the respective nozzle 54 is opened and a cooling fluid of 0.1 to 10 m$^3$/min, for example, 3 m$^3$/min, such as chilled air is fed via the blow-in port 56 of the inlet nozzle 54 into the spacing between the reaction tube 12 and the liner tube 22 to subject that area to forced air cooling for about 30 minutes. The respective air coming from the inlet nozzle 54 is blown horizontally (in the counterclockwise direction as viewed in the top plan view) into the ambient around the reaction tube 12 and, while being spirally rotated around the reaction tube 12 by absorbing the heat of the reaction tube 12, eventually exhausted via the topmost exhaust nozzle 74. As set forth above, the temperature prevalent in the uniformly heated zone 18 in the reaction tube 12 is detected on a continuous basis, and the amount of cooling fluid coming from the respective inlet nozzle 54 is individually controlled in accordance with the detection temperature level. The control of the fluid flow is accomplished by operating the respective control value 64 on the basis of the aforementioned detection temperature data and controlling the degree of opening of the control valve 64.

In the above embodiment, not only is it possible to obtain uniformity of heat in the horizontal plane, since the respective air stream, that is, chilled air, ascends spirally around the reaction tube 12, but it is also possible to assure vertical uniformity of temperature along the length of the heated zone 18, since the cooling fluid is blown at a plurality of locations, along the length of the reaction tube 12 and the flow of the fluid is varied in accordance with the detected temperature data. High cooling efficiency can be obtained, due to the direct cooling of the reaction tube 12 by a combined stream of the chilled air emitted from the respective nozzles. It is also possible to avoid a possible adverse effect caused by the oxidation, etc., resulting from the direct contact of the fluid, such as chilled air, with the heater 24 placed under a high temperature condition.

Figure 5:
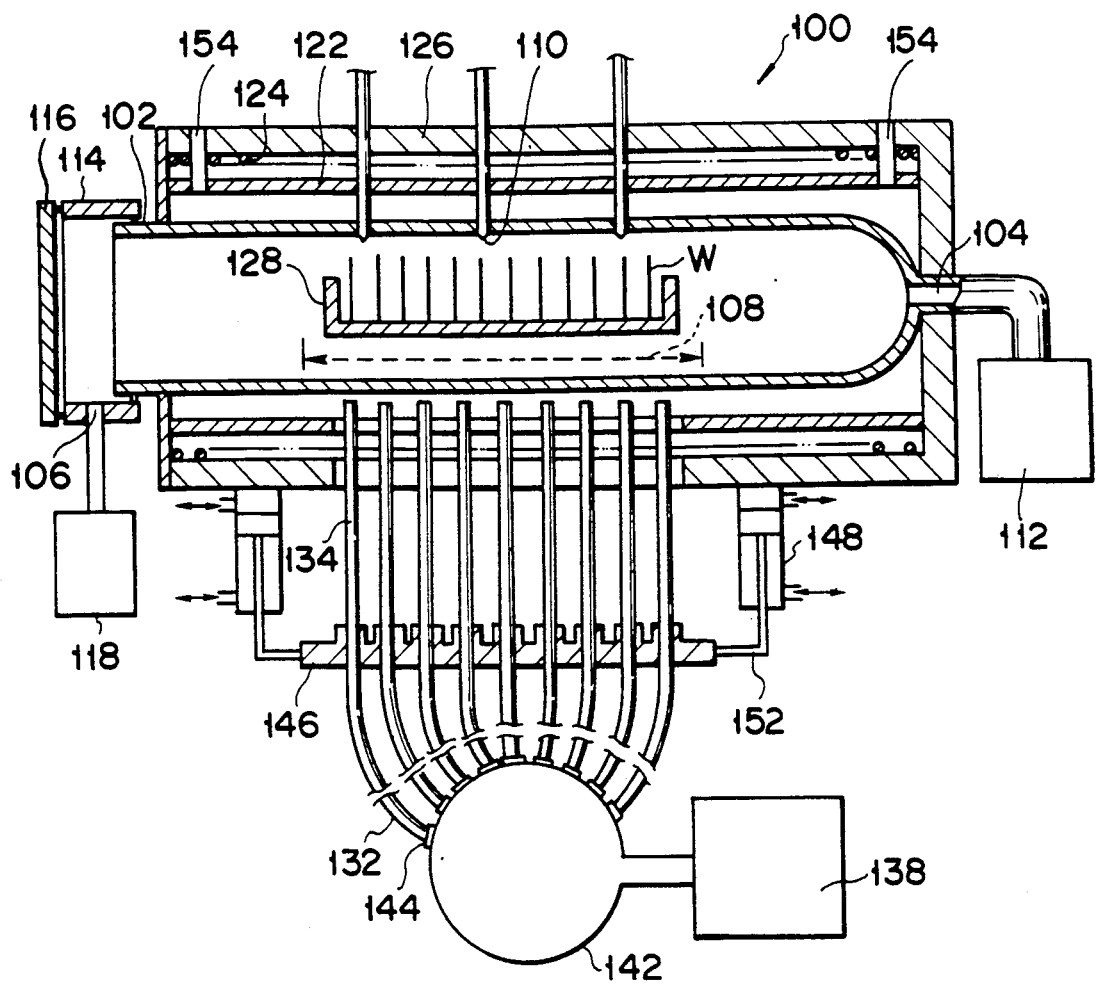
FIG. 5 is a front view, in cross-section, showing a horizontal type heat treating apparatus with a reaction tube cooling system according to a third embodiment of the present invention.

FIG. 5 shows a horizontal type heat treatment apparatus 100 with a reaction tube cooling system according to a third embodiment of the present invention.

A pipe 104 is connected to one end of a substantially horizontally arranged reaction tube 102 to conduct a predetermined reaction gas to the reaction tube. The pipe is connected to a gas supply source 112. The other end of the reaction tube 102 is closed by an end cap 114 equipped with a closure 116, and an exhaust pipe 106 leading to a recover section 118 is connected to the cap 114.

In order to provide a uniformly heated zone 108 within the reaction tube, a liner tube 122 made of, for example, silicon carbide is coaxially arranged around the reaction tube 102. A heating device, such as a coil-like heater 124, is wounded around the liner tube 122 with a spacing left therebetween. Heat insulation 126 is arranged around the heater 124 and has a dense and smooth inner wall surface.

The temperature of a uniformly heated zone 108 in the reaction tube 102 is detected on a continuous basis by sensors 110, such as thermocouples located at three places. The detection temperature level is transmitted as data to the control mechanism (not shown). The mechanism controls, based on the temperature level data, electric power to the heater 124 and an amount of fluid coming from respective cooling fluid inlet nozzles 134 as set forth above.

Figure 6:
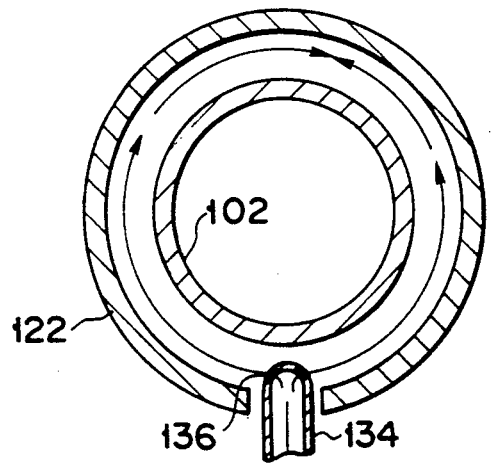
FIG. 6 is a side view, partly in cross-section, showing the apparatus of FIG. 5.

As shown in FIG. 6, a plurality of cooling fluid inlet nozzles 134 are provided in one array substantially along a whole length of the uniformly heated zone such that they face the lowest portion of the reactor tube 102. Although, in the arrangement shown in FIG. 5, nine inlet nozzles are shown by way of example, fifteen or more inlet nozzles may be provided in actual practice, in accordance with the size, etc., of the reaction tube. The inlet nozzles 134 are made of ceramics and have an inner diameter of 6 to 8 mm. The inlet nozzle 134 extend through those slits of the heat insulation 126 and liner tube 122 into an inner spacing; that is, the forward ends of the inlet nozzles extend into the inner spacing between the reaction tube 102 and the liner tube 122. The blow in ports of the forward ends of the respective inlet nozzles 134 are so oriented as to inject a cooling fluid in two directions along the outer surface of the reaction tube 102 in a vertical plane, as shown in FIG. 6, which is viewed in the horizontal direction.

The respective inlet nozzles 134 are connected via the pipe 132 to a manifold 142 which, in turn, is connected via a blower, not shown, to a cooling fluid supply source 138. In the neighborhood of the manifold 142, control valves 144 are provided one for each pipe 132 associated with the nozzle 134 whereby a flow of the cooling fluid can be controlled independently for each inlet nozzle.

Outside the heat insulation 126, the respective inlet nozzles 134 are fixes to a common support plate 146 which, in turn, is attached at each end to a piston rod 152 which is associated with an air cylinder 148. The support plate 146 is driven by the air cylinder 148 and moved toward and away from the outer surface of the heat insulation 126. As a result, the respective inlet nozzles 134 can be moved between an extending position where the forward ends of the inlet nozzles 134 extend through the inner surface of the liner tube 122 toward the reaction tube 102 and a retracted position where the forward ends of the inlet nozzles 134 are retracted into the inner surface of the liner tube 122.

Cooling fluid discharge nozzles 154 are so provided as to face both end portions of the uppermost side of a longitudinal section of the reaction tube 102. Outside the heat insulation 126, the exhaust nozzles 154 is connected to a suction means not shown and the forward end portions of the exhaust nozzles extend through the liner tube 122 into a spacing between the liner tube 122 and the reaction tube 102 so that their suction ports open into that spacing.

In use, the interior of the reaction tube 102 in the aforementioned heat treating apparatus 100 is initially heated by the heater to a predetermined treatment temperature. Then a closure 116 of an end cap 114 is opened and a plurality of products, such as semiconductors wafers W on a wafer boat 128, are loaded (for example softly landed). A predetermined reaction gas flows into the reaction tube 102 to form a film, on or conduct diffusion and so on of the semiconductor wafer. At the time of heating the reaction tube 102, the air cylinders 148 are operated by a mechanism, not shown, to hold all the inlet nozzles 134 at the retracted position. Thus the input nozzles 134 are held in the inner surface of the liner tube 122, preventing a fall in thermal efficiency resulting from the conduction etc., of heat through the nozzle.

Figure 7:
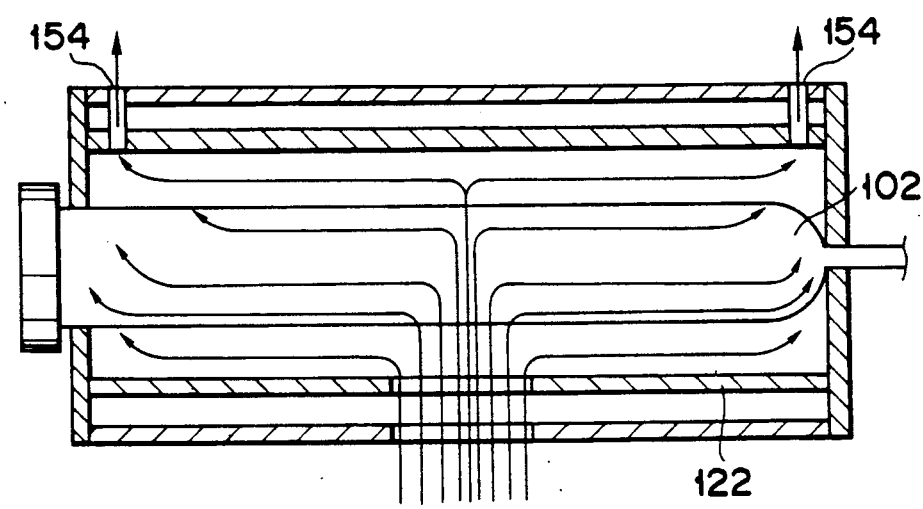
FIG. 7 is a view showing a flow pattern of a cooling fluid along a longitudinal direction of the reaction tube in the apparatus shown in FIG. 5.

If the interior of the reaction tube 102 is to be rapidly cooled, the air cylinder 148 is operated by the control mechanism, not shown, all the inlet nozzles 134 are so moved that their forward end portions are shifted through the inner surface of the liner tube into the proximity of the reaction tube 102. The flow control valves 144 associated with the nozzles 134 are opened, feeding a cooling fluid of 0.1 to 10 cm³/min, for example, 3 m³/min, such as chilled air, via the blow in ports 136 into the spacing between the reaction tube 102 and the liner tube 122 to allow forced air cooling to be carried out for about 30 minutes. The respective air coming from the respective inlet nozzle 134 is blown in two directions along the circumference of the reactor tube 102 to follow a flow pattern as indicated in FIG. 6. At the same time, as shown in FIG. 7, the air generally moves in a flow pattern in the longitandinal directions, being drawn through the discharge nozzles 154 which are provided at both the end portions of the reaction tube 102. The moving air as set out above absorbs heat from the reaction tube 102 and is exhausted eventually through the exhaust nozzles 154. As set forth above, the temperature prevailing in the uniformly heated zone 108 within the reaction tube 102 is detected on a continuous basis, and the amount of cooling fluid flowing from the inlet nozzle 134 is individually controlled in accordance with the detected temperature level. The control of the flow, as set forth above, is carried out by operating the control mechanism to vary the degree of opening of the control valve 144, on the basis of the detected temperature data.

In the embodiment as set forth below, the air, that is, the cooling fluid is blown at a plurality of spots in the aforementioned spacing generally over a whole length of the uniformly heated zone at a flow level of the fluid which is varied in accordance with the detected temperature data. Since the fluid is so blown into that spacing while being drawn in the directions in which the exhaust nozzles 154 are formed, the uniformity of the temperature is obtained both in the direction horizontal to the length of the uniformly heated zone 18 and in the direction perpendicular to the horizontal direction. The reaction tube 12 is directly cooled in a combined flow pattern, assuring a high cooling efficiency and thus avoiding an adverse effect caused from the cooling fluid, such as the oxidation etc., resulting from the direct contact of the chilled fluid (air) with the hot heater 24.

Although the present invention has been described in detail in conjunction with the desired embodiments illustrated in the accompanying drawings, it should be understood that various changes and modifications of the present invention can be made without departing from the spirit and scope thereof.

What is claimed is:

1. A vertical type heat-treating apparatus, comprising:
    a reaction tube extending substantially vertically along a longitudinal direction and containing a uniformly heated zone in which an object to be heat-treated is received;
    a coil-like heater surrounding the reaction tube;
    a liner tube provided between said reaction tube and said heater;
    a plurality of inlet nozzles through which a cooling fluid is forcedly introduced toward the reaction tube, said inlet nozzles being arranged at predetermined intervals along the longitudinal direction and the circumference of the reaction tube, and passing through gaps between coils of said heater and penetrating said liner tube so as to extend perpendicularly and near to respective surface portions of said reaction tube; and
    exhaust means, located substantially at the uppermost end of the reaction tube, for exhausting the cooling fluid from around the reaction tube; wherein
    each nozzle discharges the cooling fluid in a direction parallel to a tangent drawn to the circumference of the reaction tube at a point where the reaction tube and the respective nozzle are closest, so as to permit the cooling fluid to form a swirl around an other wall of the reaction tube, to thereby directly cool the outer wall of the reaction tube.

2. The apparatus according to claim 1, wherein said inlet nozzles are arranged, in a horizontal plane, at positions predetermined with respect to the circumference of the reaction tube, and a group of such horizontal arrangements of inlet nozzles are provided at a plurality of locations along the longitudinal direction of said reaction tube.

3. The apparatus according to claim 1, in which the intervals of said inlet nozzles become smaller in the longitudinal direction toward an upper portion of said reaction tube.

4. The apparatus according to claim 1, in which a plurality of temperature sensors are provided along the longitudinal direction of said reaction tube, and said flow of the cooling fluid blown from the respective inlet nozzles is individually controlled based on detection temperature data of the sensors.

5. The apparatus according to claim 1, in which said inlet nozzles are movable between a position where a forward end of each of said inlet nozzles extends from the inner surface of said liner tube toward the proximity of the reaction tube and a position where the forward end of each of said inlet nozzles is retracted into the inner surface of the liner tube.

* * * * *